United States Patent
Suzuki et al.

(10) Patent No.: US 11,448,684 B2
(45) Date of Patent: Sep. 20, 2022

(54) POWER MODULE

(71) Applicant: SHINDENGEN ELECTRIC MANUFACTURING CO., LTD., Tokyo (JP)

(72) Inventors: Kenichi Suzuki, Saitama (JP); Wataru Miyazawa, Saitama (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 272 days.

(21) Appl. No.: 16/955,773

(22) PCT Filed: Dec. 22, 2017

(86) PCT No.: PCT/JP2017/046185
§ 371 (c)(1),
(2) Date: Jun. 19, 2020

(87) PCT Pub. No.: WO2019/123643
PCT Pub. Date: Jun. 27, 2019

(65) Prior Publication Data
US 2020/0341047 A1    Oct. 29, 2020

(51) Int. Cl.
*G01R 31/26* (2020.01)
*H02M 1/08* (2006.01)
(Continued)

(52) U.S. Cl.
CPC ............. *G01R 31/26* (2013.01); *H02M 1/08* (2013.01); *H03K 17/08* (2013.01); *H03K 17/163* (2013.01); *H03K 17/687* (2013.01)

(58) Field of Classification Search
CPC ............... G01R 31/26; G01R 31/2642; G01R 31/2621; G01R 31/265; H03K 17/08; H03K 17/163; H03K 17/687
See application file for complete search history.

(56) References Cited

U.S. PATENT DOCUMENTS 9,285,407 B2 * 3/2016 Nakata .................. G01R 31/26
9,960,770 B2 * 5/2018 Hwang .......... H03K 19/018521
(Continued)

FOREIGN PATENT DOCUMENTS

WO    2012153459 A1    11/2012

OTHER PUBLICATIONS

International Search Report in PCT/JP2017/046185, dated Feb. 13, 2018. 2pp.

*Primary Examiner* — Ryan Johnson
*Assistant Examiner* — Colleen J O Toole
(74) *Attorney, Agent, or Firm* — Hauptman Ham, LLP

(57) ABSTRACT

A power module according to the present invention switches an operation mode between a control mode where an ON/OFF operation of a switching element having a first electrode, a second electrode, and a third electrode is controlled, and a deterioration determination mode where the deterioration is determined based on information including ΔVgs based on information including a threshold voltage detected before a stress current is supplied to the switching element and a threshold voltage detected after the stress current is supplied to the switching element. According to the power module of the present invention, the deterioration can be determined during an operation time and hence, breaking of the device can be prevented, and operation efficiency of the power module can be increased, and a manufacturing cost of the power module can be lowered.

14 Claims, 13 Drawing Sheets

(51) Int. Cl.
*H03K 17/08* (2006.01)
*H03K 17/16* (2006.01)
*H03K 17/687* (2006.01)

(56) References Cited

U.S. PATENT DOCUMENTS

2010/0318313 A1* 12/2010 Agarwal ........ G01R 31/318511
    702/117
2013/0147525 A1    6/2013 Takagiwa
2014/0095126 A1*   4/2014 Weir ..................... G06F 30/398
    703/2

* cited by examiner

POWER MODULE

RELATED APPLICATION

The present application is a National phase of International Application number PCT/JP20171/046185, filed Dec. 22, 2017.

TECHNICAL FIELD

The present invention relates to a power module.

BACKGROUND ART

Conventionally, there has been known a power module which controls an ON/OFF operation of a switching element (see patent document 1, for example).

As shown in FIG. 16, a conventional power module 900 includes: a switching element 800 having a first electrode, a second electrode, and a gate electrode; and a gate voltage control part 910 which controls a gate voltage so as to control an on/off operation of the switching element 800.

According to the conventional power module 900, an ON/OFF operation of the switching element 800 can be controlled by controlling a gate voltage using the gate voltage control part 910.

PRIOR ART DOCUMENT

Patent Document

Patent document 1: WO/2012/153459

SUMMARY OF INVENTION

Problem to be Solved by the Invention

Recently, there has been a demand for a power module which can determine the deterioration of a device such as a power module or a part of the power module like a switching element (simply referred to as "deterioration" hereinafter) during an actual in-use time of the device. However, in reality, the determination of deterioration during an actual in-use time (during an operation period) is difficult and hence, there exists a concern that a device is broken due to the continuous use of the device in a deteriorated state. To obviate such a drawback, a case is considered where a device is periodically exchanged before the deterioration occurs. In this case, however, the frequency of exchanging the device is increased. As a result, there arise not only a drawback that the operation efficiency of the device is lowered but also a drawback that a manufacturing cost of the device is increased.

The present invention has been made to overcome the above-mentioned drawback, and it is an object of the present invention to provide a power module where the breaking of the device can be prevented by determining deterioration during an actual in-use time, an operation efficiency of the device can be enhanced, and a manufacturing cost of the device can be reduced.

Solution to Problem

[1] According to the present invention, there is provided a power module configured to switch an operation mode between: a control mode where an ON/OFF operation of a switching element having a first electrode, a second electrode, and a third electrode is controlled; and a deterioration determination mode where $\Delta Vgs$ is calculated based on information including a threshold voltage detected before a stress current is supplied to the switching element and a threshold voltage detected after the stress current is supplied to the switching element, and deterioration is determined based on information including the $\Delta Vgs$.

In this specification, $\Delta Vgs$ means a value which is calculated based on two threshold voltages consisting of a threshold voltage which is obtained by measurement before a stress current is supplied to the switching element and a threshold voltage which is obtained by measurement again after the stress current is supplied to the switching element for a predetermined period (substantially, a difference between the threshold voltage which is detected before the stress current is supplied to the switching element and the threshold voltage which is detected after the stress current is supplied to the switching element.

[2] In the power module according to the present invention, it is preferable that the power module include: the switching element; a third electrode voltage control part which controls a third electrode voltage such that the third electrode voltage is increased in a stepwise manner when a threshold voltage is measured in the deterioration determination mode, and controls the third electrode voltage for controlling an ON/OFF operation of the switching element in the control mode; an ON/OFF state determination part which determines an ON/OFF state of the switching element in the deterioration determination mode; a memory part which stores an initial $\Delta Vgs$ of the switching element, and in the deterioration determination mode, stores the third electrode voltage applied to the third electrode as a threshold voltage when the ON/OFF state determination part determines that the switching element is brought into an ON state; a deterioration determination part which, in the deterioration determination mode, calculates the $\Delta Vgs$ based on information including a threshold voltage detected before the stress current is supplied to the switching element and a threshold voltage detected after the stress current is supplied to the switching element, and determines the deterioration based on information including the $\Delta Vgs$ and the initial $\Delta Vgs$; and a power circuit which is connected with the switching element in series, and has a load resistor and a drive power source.

[3] In the power module according to the present invention, it is preferable that the power module be configured to perform an initial measurement mode where the initial $\Delta Vgs$ of the switching element is detected before the control mode is performed, in the initial measurement mode, the third electrode voltage control part control the third electrode voltage such that the third electrode voltage is increased in a stepwise manner when a threshold voltage is measured, the ON/OFF state determination part determine an ON/OFF state of the switching element, the memory part store the third electrode voltage applied to the third electrode as a threshold voltage when the ON/OFF state determination part determines that the switching element is brought into an ON state, and the deterioration determination part calculate the initial $\Delta Vgs$ based on information including an initial threshold voltage which is the threshold voltage detected before the stress current is supplied to the switching element and a threshold voltage detected after the stress current is supplied to the switching element.

[4] In the power module according to the present invention, it is preferable that the third electrode voltage control part, in the control mode, control the third electrode voltage based on information including the initial threshold voltage measured by the initial measurement mode when the switching element is brought into an ON state.

[5] In the power module according to the present invention, it is preferable that the power module further include a temperature detection part which detects an operation temperature of the switching element, wherein the memory part further store information relating to a temperature characteristic of a threshold voltage in the switching element, and information including an initial operation temperature of the switching element, and the deterioration determination part determine the deterioration based on information relating to a temperature characteristic of a threshold voltage in the switching element, and information including the initial ΔVgs, the ΔVgs detected in the deterioration determination mode, the initial operation temperature, and an operation temperature of the switching element detected by the temperature detection part in the deterioration determination mode.

[6] In the power module according to the present invention, it is preferable that the power module further include a threshold voltage calculation part which calculates a threshold voltage during the operation of the switching element based on information including the operation temperature of the switching element detected by the temperature detection part, the initial threshold voltage and the initial operation temperature of the switching element, and information relating to a temperature characteristic of a threshold voltage in the switching element, wherein the third electrode voltage control part, in the control mode, control the third electrode voltage based on a threshold voltage during the operation of the switching element calculated by the threshold voltage calculation part when the switching element is brought into an ON state.

[7] In the power module according to the present invention, it is preferable that the power module be a power module which further performs a temperature characteristic measurement mode where a temperature characteristic of a threshold voltage in the switching element is measured, the power module further include a temperature characteristic calculation part which calculates a temperature characteristic of a threshold voltage in the switching element, wherein in the temperature characteristic measurement mode, the third electrode voltage control part control the third electrode voltage such that the third electrode voltage is increased in a stepwise manner, the ON/OFF state determination part determine whether or not the switching element is turned on, the memory part, when the ON/OFF state determination part determines that the switching element is brought into an ON state, store the operation temperature of the switching element, and store the third electrode voltage applied to the third electrode as a temperature characteristic measurement time threshold voltage of the switching element, and the temperature characteristic calculation part calculate a temperature characteristic of a threshold voltage in the switching element based on the information including the initial threshold voltage, the initial operation temperature of the switching element when the initial threshold voltage is measured, the operation temperature of the switching element detected by the temperature detection part in the temperature characteristic measurement mode, and the temperature characteristic measurement time threshold voltage.

[8] In the power module according to the present invention, it is preferable that the power module further include a first electrode current detection part which detects a first electrode current which flows in the switching element, wherein in the deterioration determination mode, the ON/OFF state determination part determine an ON/OFF state of the switching element based on a detection result of the first electrode current obtained by the first electrode current detection part.

[9] In the power module according to the present invention, it is preferable that the power module further include an alarm part which displays a detection result of the deterioration obtained by the deterioration determination part to an outside.

[10] In the power module according to the present invention, it is preferable that the power module further include a stress current supply part which supplies the stress current to the switching element in the deterioration determination mode.

[11] In the power module according to the present invention, it is preferable that supplied power be constant in the power circuit, and in the deterioration determination mode, the stress current be supplied from a current which flows from the drive power source.

[12] In the power module according to the present invention, it is preferable that the third electrode voltage control part, when a threshold voltage of the switching element is detected, control the third electrode voltage such that the third electrode voltage is increased in a stepwise manner along with a lapse of time.

[13] In the power module according to the present invention, it is preferable that the third electrode voltage control part, when a threshold voltage of the switching element is detected, control the third electrode voltage such that the third electrode voltage becomes a pulse-like voltage which is a pulse whose amplitude is increased along with a lapse of time.

[14] In the power module according to the present invention, it is preferable that the switching element be formed of a material which contains GaN, SiC, or $Ga_2O_3$.

Advantageous Effects of Invention

The power module according to the present invention is configured to perform the deterioration determination mode where ΔVgs is calculated based on a threshold voltage detected before a stress current is supplied to the switching element and a threshold voltage detected after the stress current is supplied to the switching element, and the deterioration is determined based on information including the ΔVgs. Accordingly, the deterioration during an actual in-use time (operation time) can be determined and hence, it is possible to prevent breaking of the device caused due to the continuous use of the device in a deteriorated state.

The power module according to the present invention is configured to perform the deterioration determination mode where ΔVgs is calculated based on information including a threshold voltage detected before a stress current is supplied to the switching element and a threshold voltage detected after the stress current is supplied to the switching element, and the deterioration is determined based on information including the ΔVgs. Accordingly, a user who uses the device gets to know a timing at which the device deteriorates and hence, the user can exchange the device at the timing (the timing on a stage that the device deteriorates) whereby it is unnecessary for the user to periodically exchange the device before the device deteriorates. As a result, frequency of exchanging the device can be reduced and hence, operation efficiency of the device can be enhanced and a cost can be suppressed.

BRIEF DESCRIPTION OF DRAWINGS

FIG. 8A is the schematic view of the graph indicating the change with time of the gate-source voltage Vgs when a gate voltage is applied to a gate electrode in a power module according to a comparison example, FIG. 8B is the schematic view of the graph indicating the change with time of the gate-source voltage Vgs when a gate voltage which slightly exceeds a threshold voltage is applied to a gate electrode in the power module 1 according to the embodiment 1.

DESCRIPTION OF EMBODIMENTS

Hereinafter, a power module according to the present invention is described based on embodiments shown in drawings. The respective drawings are schematic views, and do not always strictly reflect the actual circuit configuration and actual graphs.

Embodiment 1

1. Configuration of Power Module 1 According to Embodiment 1

Figure 1:
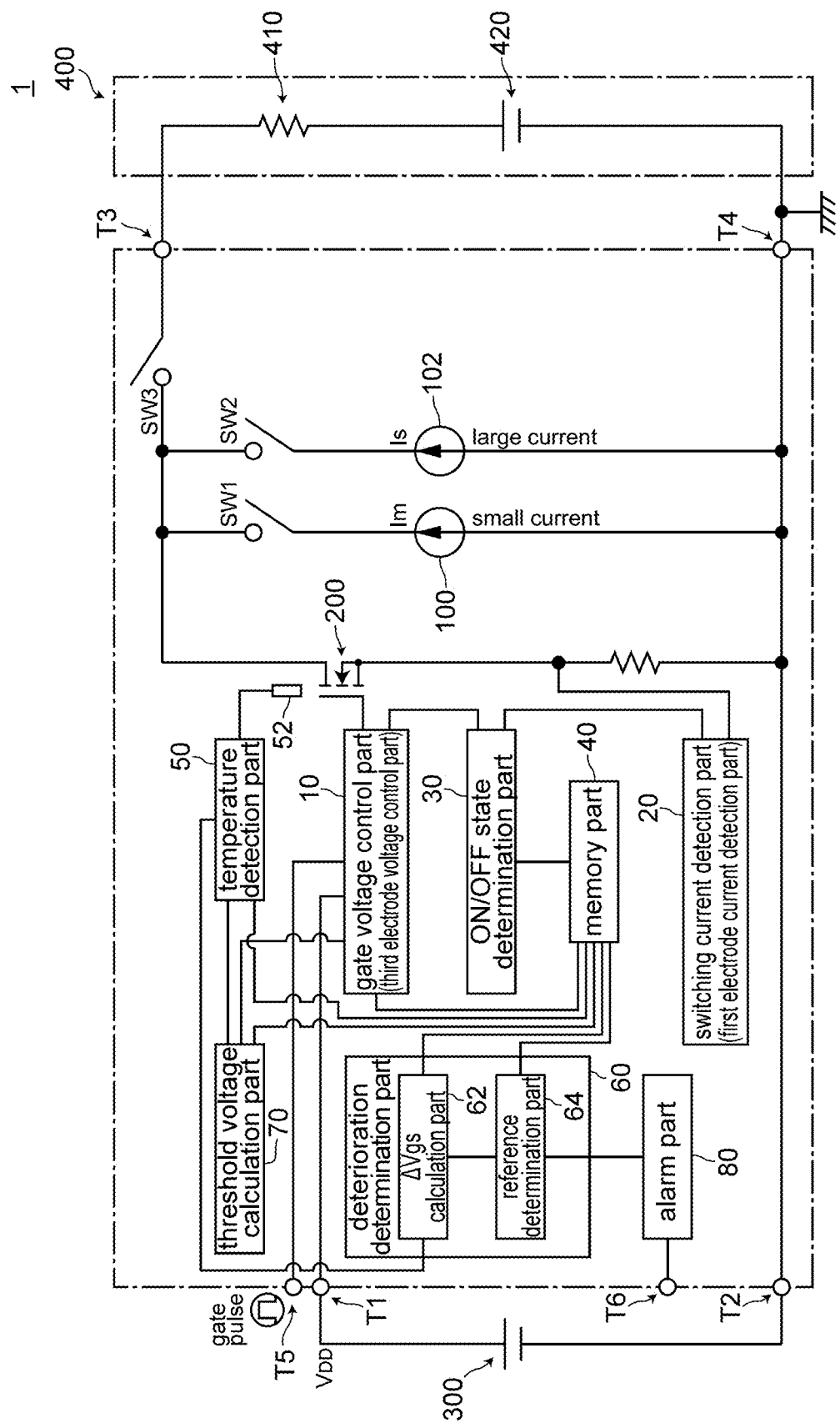
FIG. 1 is a circuit diagram of a power module 1 according to an embodiment 1.

As shown in FIG. 1, the power module 1 according to the embodiment 1 includes a switching element 200, a gate voltage control part 10 (third electrode voltage control part), a switching current detection part (first electrode current detection part) 20, an ON/OFF state determination part 30, a memory part 40, a temperature detection part 50, a deterioration determination part 60, a threshold voltage calculation part 70, an alarm part 80, a measurement current supply part 100, a stress current supply part 102, and a power circuit 400. The power module 1 according to the embodiment 1 is covered by a package formed of a resin, a ceramic or the like having high heat resistance and high insulation property. The power module 1 according to the embodiment 1 includes: a (+) side input terminal T1 to which a power source voltage $V_{DD}$ of a direct current is inputted; a (−) side input terminal T2 on a ground side; a (+) side output terminal T3; a (−) side output terminal T4 on a ground side; a control terminal T5 to which a drive signal (for example, a gate pulse) Pg is inputted; and an alarm signal terminal T6 for transmitting an alarm signal to an alarm part (not shown in the drawing) disposed outside. A switch SW3 is disposed between the power circuit 400 and the switching element 200.

A gate drive power source 300 for applying a power source voltage $V_{DD}$ is connected between the (+) side input terminal T1 and the (−) side input terminal T2. The gate drive power source 300 is connected to a gate electrode of the switching element 200 via the gate voltage control part 10, and supplies a voltage to the gate electrode. The power circuit 400 is connected to the (+) side output terminal T3 and the (−) side output terminal T4.

The power circuit 400 is connected in series with the switching element 200. The power circuit 400 has a load resistor 410 and a drive power source 420 of a direct current, and the load resistor 410 and the drive power source 420 of a direct current are connected in series between the (+) side output terminal T3 and the (−) side output terminal T4. The (−) side output terminal T4 is grounded.

The switching element 200 is a MOSFET having a source electrode (second electrode), a drain electrode (first electrode), and a gate electrode (third electrode). The switching element 200 is brought into an ON state when a gate voltage (third electrode voltage) which exceeds a threshold voltage is applied to the gate electrode, and is brought into an OFF state when the gate voltage becomes lower than a threshold voltage. The gate voltage is supplied from the power source voltage $V_{DD}$, and is controlled by the gate voltage control part 10. In this embodiment 1, a MOSFET is used as the switching element 200. However, a suitable switching element can be used as the switching element 200. The switching element 200 is formed using a material which contains GaN. When the switching element 200 is formed using a material which contains GaN, a difference between an absolute maximum rated voltage and a threshold voltage of the gate electrode becomes small.

The drain electrode of the switching element 200 is connected to the power circuit 400 via the (+) side output terminal T3. The gate electrode of the switching element 200 is connected to the gate voltage control part 10. The source electrode of the switching element 200 is connected to the (−) side output terminal T4 via a resistor.

The gate voltage control part 10, based on an inputted drive signal Pg (for example, a gate pulse), controls a gate voltage such that the gate voltage is increased in a stepwise manner when a threshold voltage is measured in an initial measurement mode and a deterioration determination mode, and controls the gate voltage for controlling an ON/OFF operation of the switching element 200 in a control mode. The gate voltage control part 10 is connected to the ON/OFF state determination part 30, the memory part 40, and the threshold voltage calculation part 70.

The switching current detection part 20 is connected to the source electrode of the switching element 200, and detects a switching current Id (also referred to as a first electrode current, a drain current, or a source current) of the switching element 200 in the initial measurement mode and the deterioration determination mode. The switching current detection part 20 is connected to the ON/OFF state determination part 30. The switching current detection part 20 measures a current by converting the current into a voltage by supplying the current to the resistor connected to the source electrode of the switching element 200. However, the switching current detection part 20 may use a suitable detection device (for example, a Rogowski coil or the like) for such a measurement.

The ON/OFF state determination part 30, in the initial measurement mode and the deterioration determination mode, determines an ON/OFF state of the switching element 200 based on a detection result of a switching current received from the switching current detection part 20. The ON/OFF state determination part 30 is connected to the gate voltage control part 10 and the switching current detection part 20.

Information relating to a temperature characteristic of a threshold voltage in the switching element 200 and a reference value used for deterioration determination are stored in the memory part 40 in advance. The memory part 40 stores an initial $\Delta Vgs$, an initial threshold voltage $Vth_0$ and a threshold voltage Vth of the switching element 200, and an initial operation temperature $T_0$ and an operation temperature T of the switching element 200 which are detected or calculated in the initial measurement mode and the deterioration determination mode. The memory part 40 also stores a gate voltage applied to the gate electrode as a threshold voltage when the ON/OFF state determination part 30 determines that the switching element 200 is brought into an ON state in the initial measurement mode and the deterioration determination mode. The memory part 40 is connected to the gate voltage control part 10, the temperature detection part 50, the deterioration determination part 60 (more specifically, a $\Delta Vgs$ calculation part 62 and a reference determination part 64), and the threshold voltage calculation part 70.

The initial operation temperature $T_0$ means a temperature when an initial threshold voltage $Vth_0$ is measured.

The temperature detection part 50 has a temperature detection element 52. As the temperature detection element 52, a suitable temperature detection element such as a diode or a thermistor can be used.

In the deterioration determination mode, the deterioration determination part 60 calculates the $\Delta Vgs$ based on information including a threshold voltage detected before a stress current Is is supplied to the switching element 200 by the stress current supply part 102 and a threshold voltage detected after the stress current Is is supplied to the switching element 200 by the stress current supply part 102, and determines the deterioration based on information including the $\Delta Vgs$ and an initial $\Delta Vgs$ stored in the memory part 40. The deterioration determination part 60 has the $\Delta Vgs$ calculation part 62 and the reference determination part 64.

The $\Delta Vgs$ calculation part 62 is connected to the memory part 40 and the temperature detection part 50, and calculates the $\Delta Vgs$ (or the initial $\Delta Vgs$) in the deterioration determination mode and the initial measurement mode. The $\Delta Vgs$ calculation part 62, in the deterioration determination mode, calculates the $\Delta Vgs$ based on information on an operation temperature from the temperature detection part 50 and information on a threshold voltage stored in the memory part 40 (that is, based on a threshold voltage obtained by taking into account a change in temperature from the initial operation temperature $T_0$).

The reference determination part 64 compares "a difference between the $\Delta Vgs$ calculated by the $\Delta Vgs$ calculation part 62 and the initial $\Delta Vgs$ stored in the memory part 40" and a reference value stored in the memory part 40 to each other. The reference determination part 64 determines that the device is deteriorated when the difference between the $\Delta Vgs$ and the initial $\Delta Vgs$ is larger than the reference value.

The threshold voltage calculation part 70 reads information including an initial threshold voltage $Vth_0$ of the switching element 200 and an initial operation temperature $T_0$ of the switching element 200, and information relating to a temperature characteristic of a threshold voltage in the switching element 200 from the memory part 40, and reads an operation temperature T of the switching element 200 from the temperature detection part 50. Then, the threshold voltage calculation part 70 calculates a threshold voltage Vth during an operation by putting these information and value into a characteristic equation of $Vth=Vth_0-\alpha(T-T_0)$.

The alarm part 80 displays a detection result of the deterioration obtained by the deterioration determination part 60 to the outside. Particularly, when it is determined that the device is deteriorated by the reference determination part 64, the alarm part 80 transmits an alarm signal toward an external alarm.

The measurement current supply part 100 is connected to the drain electrode of the switching element 200 via a switch SW1. The measurement current supply part 100 supplies a measurement current Im which is a relatively small current to the drain electrode of the switching element 200 by turning on the switch SW1 in the deterioration determination mode and the initial measurement mode.

The stress current supply part 102 is connected to the measurement current supply part 100 in parallel. The stress current supply part 102 is connected to the drain electrode of the switching element 200 via a switch SW2. The stress current supply part 102 supplies a stress current Is which is a relatively large current to the switching element 200 by turning on the switch SW2 in the deterioration determination mode and the initial measurement mode.

Figure 2:
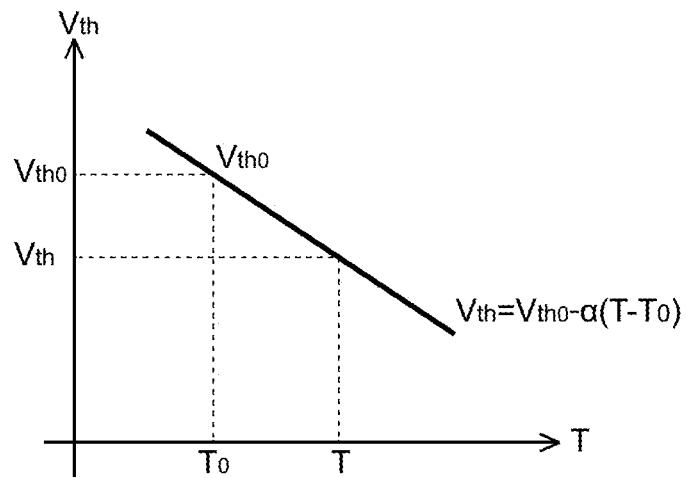
FIG. 2 is a schematic view of a graph indicating a relationship between a threshold voltage Vth and an operation temperature T of a switching element.

Assume a temperature coefficient of a threshold voltage in the switching element 200 as a, a threshold voltage during an operation of the switching element 200 as Vth, an initial threshold voltage in the switching element 200 as $Vth_0$, an operation temperature of the switching element 200 detected by the temperature detection part 50 as T, an initial operation temperature of the switching element 200 when the initial threshold voltage $Vth_0$ is measured as $T_0$. In this case, a characteristic equation which satisfies a relationship of $Vth=Vth_0-\alpha(T-T_0)$ is used as information relating to a temperature characteristic of a threshold voltage in the switching element 200 (see FIG. 2). That is, the relationship between the threshold voltage Vth and the operation temperature T of the switching element 200 is expressed by a linear function having a negative gradient.

2. Operation of Power Module 1 According to Embodiment 1

The power module 1 according to the embodiment 1 is configured to switch an operation mode among: an initial measurement mode where an initial ΔVgs of the switching element 200 is detected before a control mode is performed; the control mode where an ON/OFF operation of the switching element 200 having the drain electrode, the source electrode, and the gate electrode is controlled; and a deterioration determination mode where a ΔVgs is calculated based on information including a threshold voltage which is detected before a stress current Is is supplied to the switching element 200 and a threshold voltage which is detected after the stress current Is is supplied to the switching element 200, and the deterioration is determined based on information including the ΔVgs. In the power module 1 according to the embodiment 1, first, the initial threshold voltage $Vth_0$, the initial ΔVgs and the initial operation temperature $T_0$ are detected or calculated by performing the initial measurement mode. Next, an ON/OFF operation of the switching element 200 is controlled by performing the control mode. Then, the deterioration determination is performed by switching the operation mode to the deterioration determination mode at a predetermined timing (for example, after the power module 1 is operated in the control mode for a predetermined time). When there is no problem in the result of the deterioration determination, the operation mode returns to the control mode again. On the other hand, when there is a problem in the result of the deterioration determination, the alarm part 80 transmits an alarm signal toward the external alarm.

(1) Initial Measurement Mode

The initial measurement mode is a mode where an initial operation temperature $T_0$, an initial threshold voltage $Vth_0$ and an initial ΔVgs of the switching element 200 are measured. This mode is performed before the control mode is performed (before the switch SW3 is turned on so that electricity is supplied to the switching element 200 from the drive power source 420).

Information relating to a temperature characteristic of a threshold voltage in the switching element 200 is stored in the memory part 40 in advance. It is because that the threshold voltage changes from the initial threshold voltage $Vth_0$ due to a change in temperature of the switching element 200 (the threshold voltage being decreased when the temperature is increased, see FIG. 2) and hence, it is difficult to accurately calculate a ΔVgs unless the threshold voltage is calculated by taking into account a change in temperature. Further, it is also because that, in an actual operation, the ΔVgs is a relatively small value and hence, it is necessary to calculate the ΔVgs using the threshold voltage which is determined by taking into account a change in temperature.

(1-1) First Time Measurement of Threshold Voltage

Figure 3:
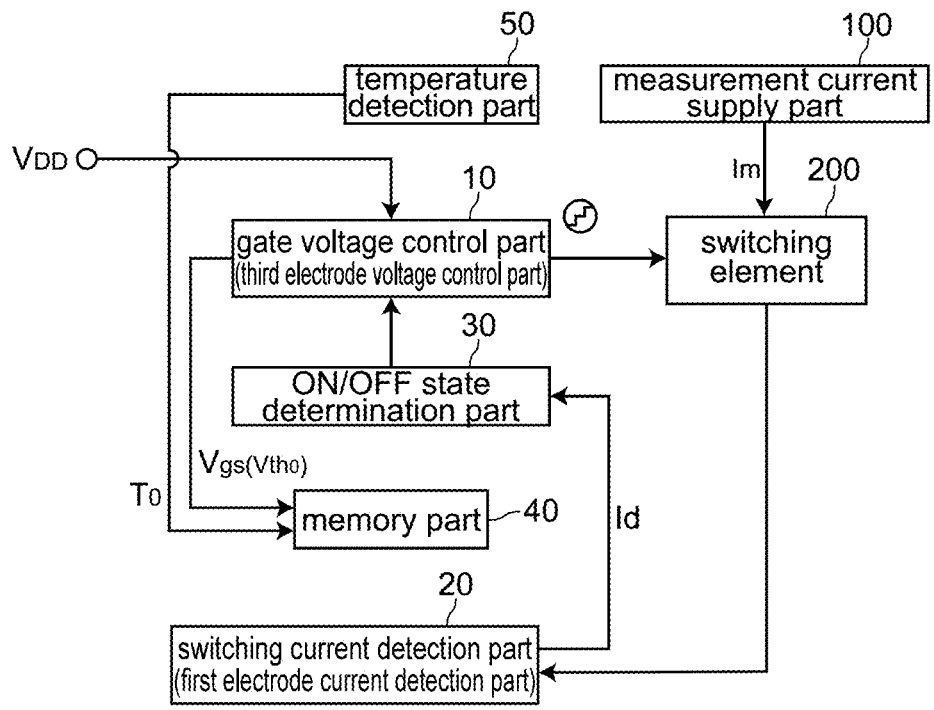
FIG. 3 is a block diagram of a circuit for measuring a threshold voltage (initial threshold voltage $Vth_0$) before a stress current Is is supplied to the switching element in an initial measurement mode.
Figure 4:
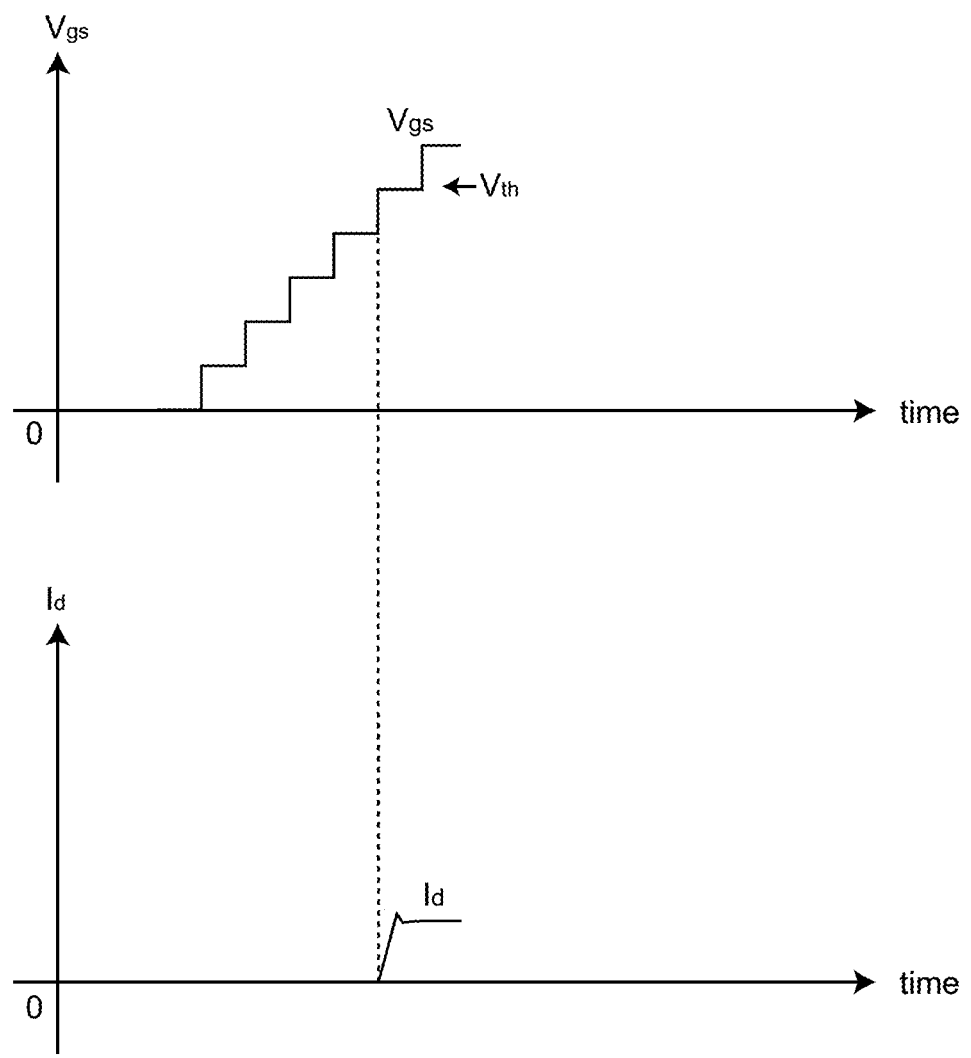
FIG. 4 is a schematic view of a graph of a gate voltage for describing an initial threshold voltage measurement mode and (or) a deterioration determination mode in an embodiment 1.

The switch SW1 is turned on in a state where the switches SW2 and SW3 are tuned off so that a measurement current Im is supplied from the measurement current supply part 100 to the switching element 200 (see FIG. 1 and FIG. 3). Next, the gate voltage control part 10 controls a gate voltage such that a voltage lower than a scheduled initial threshold voltage which is set at the time of designing the power module is applied to the gate electrode. At this stage of operation, a switching current is not detected by the switching current detection part 20 (a value of the switching current being 0) and hence, the ON/OFF state determination part 30 determines that the switching element 200 is in an OFF state. When the ON/OFF state determination part 30 determines that the switching element 200 is in an OFF state, the gate voltage control part 10 controls the gate voltage such that the gate voltage is increased by one stage (see FIG. 4).

When the gate voltage is increased in stages (specifically being increased in a stepwise manner) by repeating such an operation, and when the switching current is detected by the switching current detection part 20 (when the switching current taking a value other than 0), the ON/OFF state determination part 30 determines that the switching element 200 is in an ON state (see FIG. 3). At this stage of operation, operation temperature of the switching element 200 detected by the temperature detection part 50 is transmitted to the memory part 40 as an initial operation temperature $T_0$, and the gate voltage control part 10 transmits a gate voltage Vgs applied to the gate electrode to the memory part 40 as an initial threshold voltage $Vth_0$. The memory part 40 stores the gate voltage Vgs as an initial threshold voltage $Vth_0$.

(1-2) Supply of Stress Current Is

Figure 5:
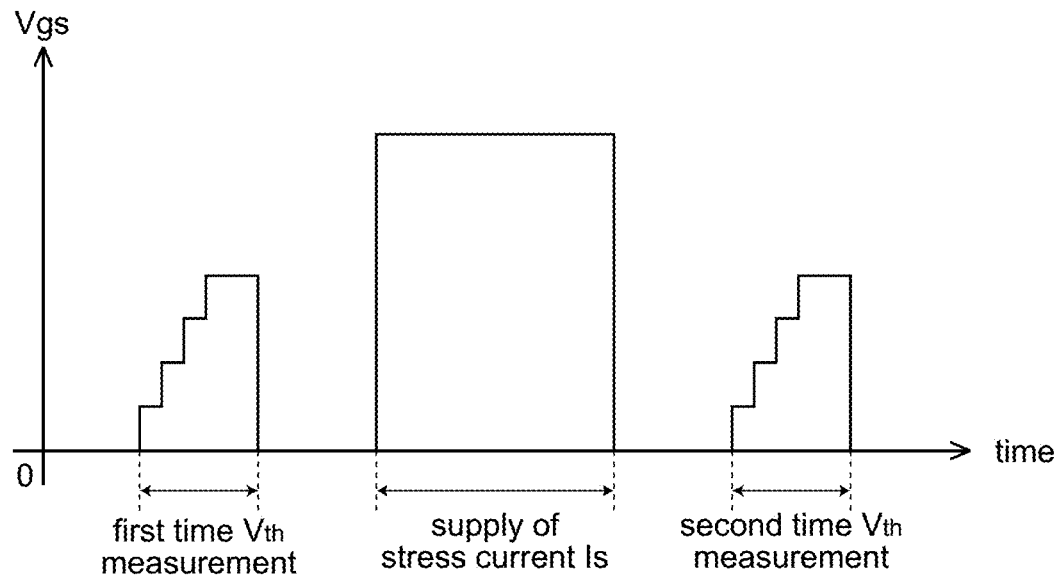
FIG. 5 is a schematic waveform chart of a gate voltage in the deterioration determination mode.

Next, the switch SW2 is turned on in a state where the switches SW1 and SW3 are turned off, a stress current Is having a predetermined current amount is supplied from the stress current supply part 102 to the switching element 200 (see FIG. 1 and FIG. 5). The gate voltage control part 10 controls the gate voltage such that the switching element 200 is in an ON state for a predetermined time (see FIG. 5). With such an operation, predetermined electricity is applied to the switching element 200 and hence, the switching element 200 generates heat.

(1-3) Second Time Measurement of Threshold Voltage

Next, the switch SW1 is turned on in a state where the switches SW2 and SW3 are tuned off so that a measurement current Im is supplied from the measurement current supply part 100 to the switching element 200 (see FIG. 1).

Figure 6:
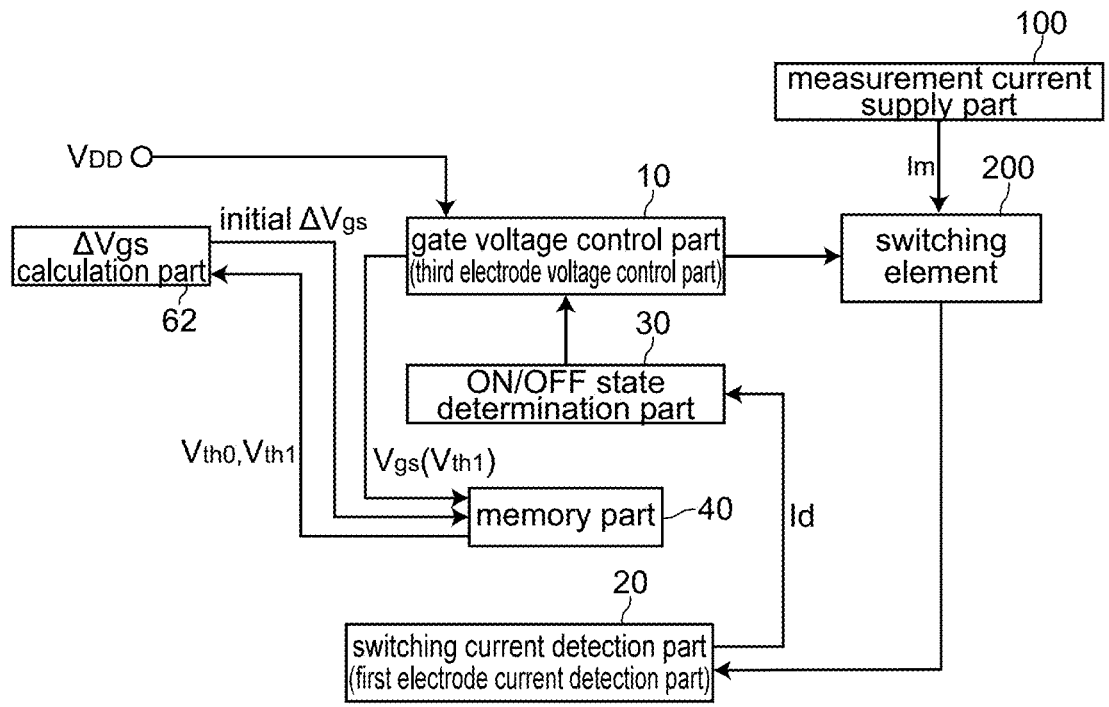
FIG. 6 is a block diagram of a circuit for measuring a threshold voltage after a stress current Is is supplied to the switching element in the initial measurement mode.

Then, a threshold voltage is measured in the same manner as the above-mentioned (1-1), the gate voltage control part 10 transmits a gate voltage Vgs applied to the gate electrode to the memory part 40 as "a threshold voltage detected after a stress current Is is supplied to the switching element" (threshold voltage $Vth_1$) (see FIG. 6). The memory part 40 stores the gate voltage Vgs as the threshold voltage $Vth_1$.

(1-4) Calculation of ΔVgs

Next, the ΔVgs calculation part 62 of the deterioration determination part 60 calculates a ΔVgs (initial ΔVgs) based on the initial threshold voltage $Vth_0$ and the threshold voltage $Vth_1$ (by subtracting the threshold voltage $Vth_1$ from the initial threshold voltage $Vth_0$). The ΔVgs calculation part 62 transmits the calculated ΔVgs (initial ΔVgs) to the memory part 40, and the memory part 40 stores the ΔVgs as an initial ΔVgs (see FIG. 6).

(2) Control Mode

After the initial measurement mode is finished, the switch SW3 is turned on in a state where the switches SW1 and SW2 are turned off so that the power circuit 400 and the switching element 200 are made conductive with each other whereby a current is supplied from the drive power source 420 to the switching element 200 (see FIG. 1).

Figure 7:
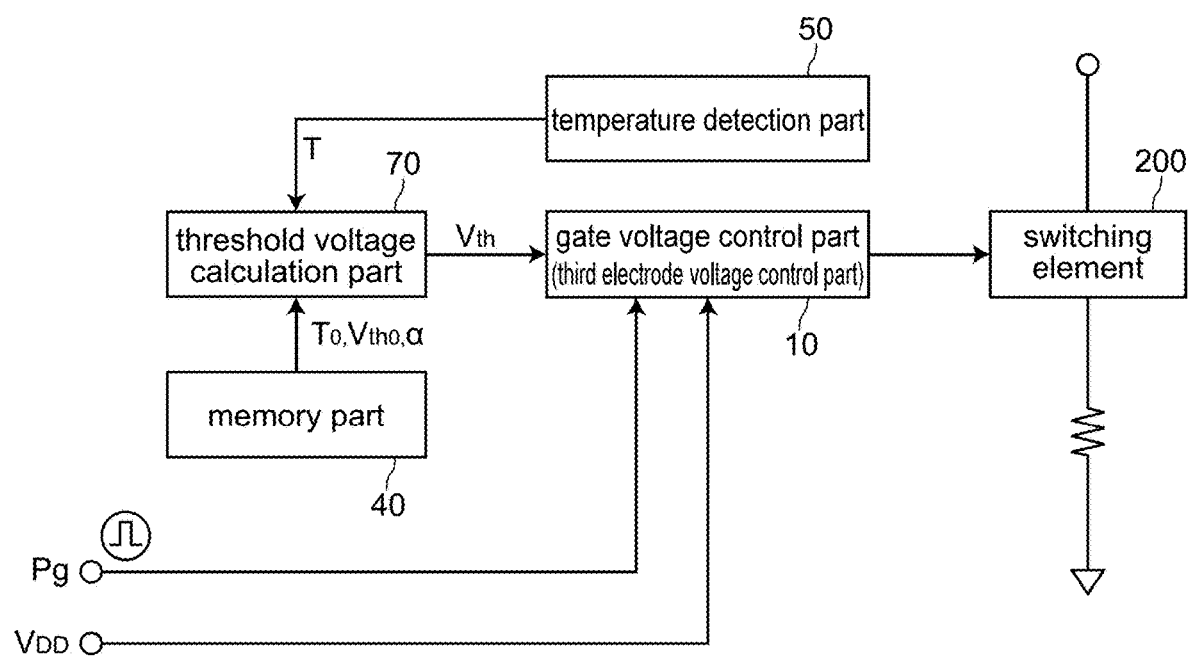
FIG. 7 is a block diagram of a control mode.

In bringing the switching element 200 into an ON state, a gate voltage applied to the gate electrode is decided as follows (see FIG. 7).

First, the temperature detection part 50 detects an operation temperature T of the switching element 200 via the temperature detection element 52.

The threshold voltage calculation part 70 reads information including an initial threshold voltage $Vth_0$ of the switching element 200 detected in the initial measurement mode and an initial operation temperature $T_0$ of the switching element 200 when the initial threshold voltage $Vth_0$ is measured, and information a relating to a temperature characteristic of the threshold voltage in the switching element 200 from the memory part 40, reads an operation temperature T of the switching element 200 from the temperature detection part 50, and calculates a threshold voltage Vth during an operation of the switching element 200 by putting these information and value to a characteristic equation of $Vth=Vth_0-\alpha(T-T_0)$.

Figure 8A:
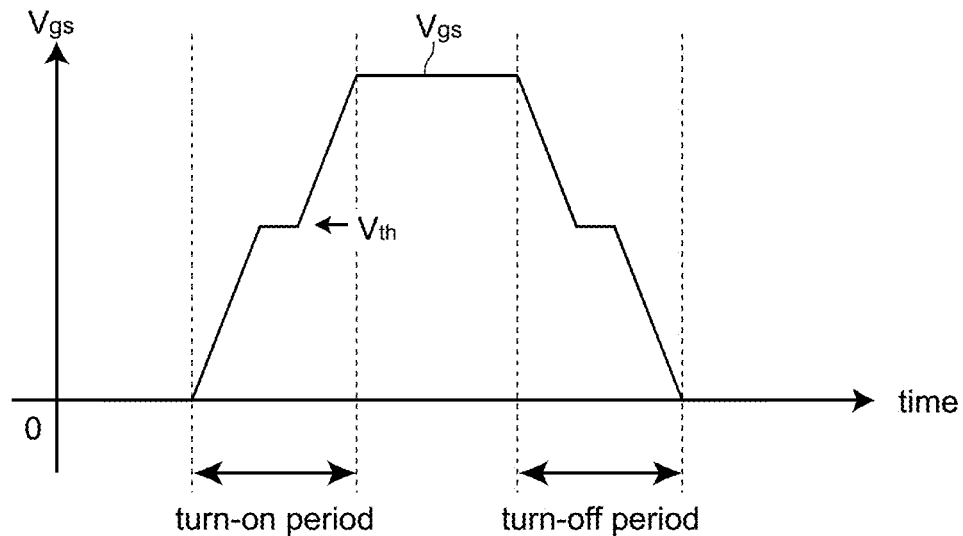
FIG. 8A and FIG. 8B are schematic views of a graph indicating a change with time of a gate voltage (gate-source voltage) Vgs for describing an effect obtained when a gate voltage which slightly exceeds a threshold voltage is applied to a gate electrode in the control mode.
Figure 8B:
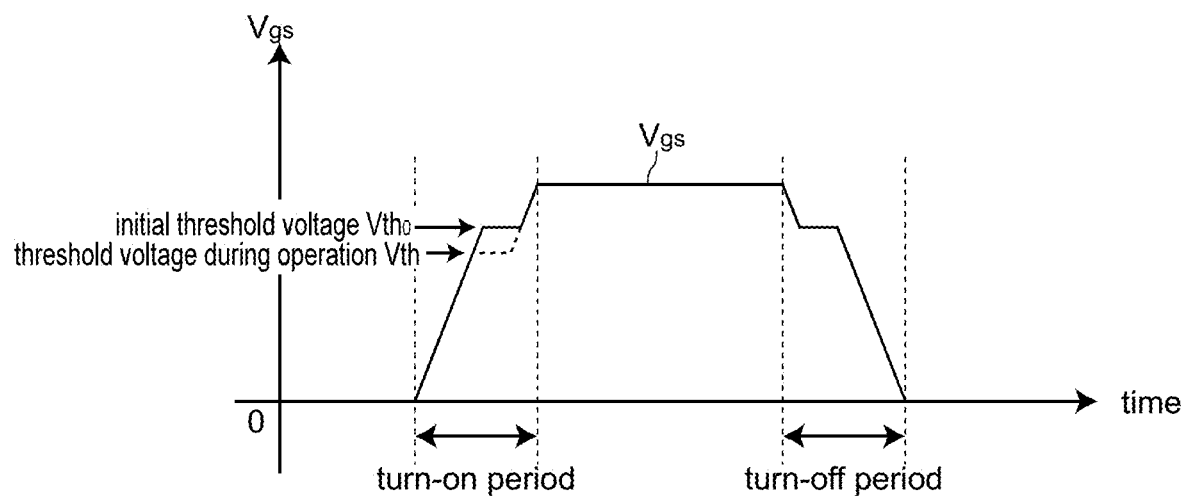

Next, the gate voltage control part 10 applies a gate voltage which slightly exceeds the threshold voltage Vth to the gate electrode (controlling the gate voltage, see FIG. 8B) based on the threshold voltage Vth during the operation of the switching element 200 which is calculated by the threshold voltage calculation part 70. In this manner, an ON/OFF operation of the switching element 200 is controlled.

In the power module 1 according to the embodiment 1, a gate voltage may be constantly controlled following a temperature of the switching element 200, or the gate voltage may be controlled based on a threshold voltage during the operation of the switching element 200 by calculating such a threshold voltage during the operation by detecting an operation temperature of the switching element 200 at a predetermined time interval.

(3) Deterioration Determination Mode

In the power module 1 according to the embodiment 1, the deterioration determination mode is performed at a predetermined timing (for example, each time the control mode is performed for a predetermined time). The deterioration determination part 60 determines the deterioration based on information relating to a temperature characteristic of a threshold voltage of the switching element 200, and information including an initial ΔVgs, a ΔVgs detected in the deterioration determination mode, an initial operation temperature $T_0$, and an operation temperature T of the switching element 200 detected by the temperature detection part 50 in the deterioration determination mode.

Figure 9:
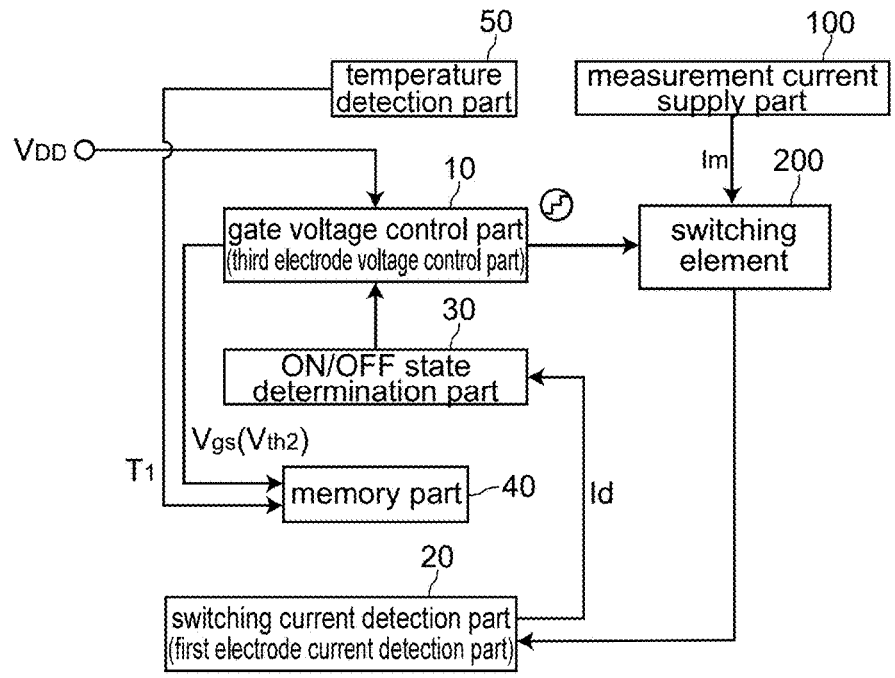
FIG. 9 is a block diagram of a circuit for measuring a threshold voltage before a stress current Is is supplied to the switching element in the deterioration determination mode.

In the deterioration determination mode, steps are performed in the order of a step (3-1) first time threshold voltage measurement, a step (3-2) supply of stress current, a step (3-3) second time threshold voltage measurement, a step (3-4) ΔVgs calculation, and a step (3-5) reference determination (deterioration determination). Among these steps, processing from the step (3-1) first time threshold voltage measurement to the step (3-3) second time threshold voltage measurement is substantially equal to processing in the initial measurement mode from the step (1-1) first time threshold voltage measurement to the step (1-3) second time threshold voltage measurement. That is, in the deterioration determination mode, the step (3-1) is performed where the first time threshold voltage measurement is performed and the operation temperature $T_1$ and the detected threshold voltage $Vth_2$ of the switching element 200 at this stage of operation are stored in the memory part 40 (see FIG. 9), the step (3-2) is performed such that a stress current Is is supplied substantially under the same condition as the supply of stress current in the initial measurement mode and, thereafter, the step (3-3) is performed such that a threshold voltage $Vth_3$ is detected by the second time threshold voltage measurement, and the detected threshold voltage $Vth_3$ is stored in the memory part 40 (see FIG. 10).

(3-4) ΔVgs Calculation

Figure 10:
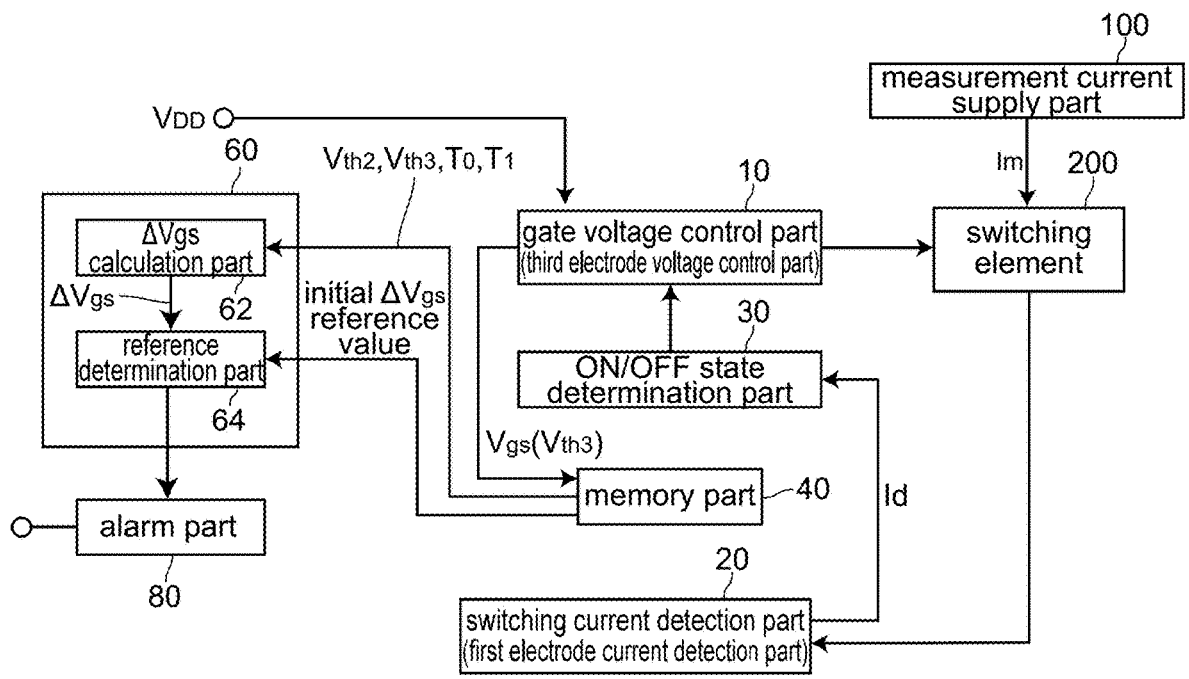
FIG. 10 is a block diagram of a circuit for measuring a threshold voltage after a stress current Is is supplied to the switching element in the deterioration determination mode.

The ΔVgs calculation part 62 calculates a ΔVgs based on the initial operation temperature $T_0$, the operation temperature $T_1$ and the threshold voltage $Vth_2$ of the switching element 200 stored in the memory part 40 in the first time threshold voltage measurement in the deterioration determination mode and the threshold voltage $Vth_3$ stored in the memory part 40 in the second time threshold voltage measurement, all of which are transmitted from the memory part 40 (see FIG. 10).

To be more specific, first, the deterioration determination part 60 (ΔVgs calculation part 62) reads information including the initial threshold voltage $Vth_0$ of the switching element 200 (detected in the initial measurement mode), the initial operation temperature $T_0$ of the switching element 200 when the initial threshold voltage $Vth_0$ of the switching element 200 is measured, the operation temperature $T_1$ and the threshold voltage $Vth_2$ of the switching element 200 stored in the memory part 40 in the first time threshold voltage measurement in the deterioration determination mode and the threshold voltage $Vth_3$ stored in the memory part 40 in the second time threshold voltage measurement, and information relating to a temperature characteristic of the threshold voltage in the switching element 200 (including a temperature coefficient α) from the memory part 40, and calculates threshold voltages $Vth_2'$ and $Vth_3'$ where temperature correction is made by putting such information into a characteristic equation of $Vth=Vth_0-\alpha(T-T_0)$.

Next, a ΔVgs is calculated by subtracting the threshold voltage $Vth_3'$ where the temperature correction is made from the threshold voltage $Vth_2'$ where the temperature correction is made. The calculated ΔVgs is transmitted to the reference determination part 64.

(3-5) Reference Determination (Deterioration Determination)

Next, the reference determination part 64 reads an initial ΔVgs and a reference value from the memory part 40, and calculates (ΔVgs–initial ΔVgs) based on the ΔVgs transmitted from the ΔVgs calculation part 62, and compares such a value and the reference value to each other. Then, the alarm part 80 displays a detection result of the deterioration obtained by the deterioration determination part 60 (reference determination part 64) to the outside. The power module 1 according to the embodiment 1 determines that the device is not deteriorated when (ΔVgs–initial ΔVgs) is smaller than the reference value, and returns to the control mode. The power module 1 according to the embodiment 1 transmits an alarm signal toward the external alarm (not shown in the drawing) from the alarm part 80 when (ΔVgs–initial ΔVgs) is larger than the reference value.

3. Advantageous Effect Acquired by the Power Module 1 According to the Embodiment 1

The power module 1 according to the embodiment 1 is configured to perform the deterioration determination mode where a ΔVgs is calculated based on information including a threshold voltage which is detected before a stress current Is is supplied to the switching element 200 and a threshold voltage which is detected after the stress current Is is supplied to the switching element 200, and the deterioration is determined based on information including the ΔVgs. Accordingly, the deterioration during an actual in-use time (operation time) can be determined and hence, it is possible to prevent breaking of the device caused due to the continuous use of the device in a deteriorated state.

The power module 1 according to the embodiment 1 is configured to perform the deterioration determination mode where a ΔVgs is calculated based on information including a threshold voltage which is detected before a stress current Is is supplied to the switching element 200 and a threshold voltage which is detected after the stress current Is is supplied to the switching element 200, and the deterioration is determined based on information including the ΔVgs. Accordingly, a user who uses the device gets to know a timing at which the device deteriorates and hence, the user can exchange the device at the timing (the timing on a stage that the device deteriorates). As a result, the user gets to know the timing at which the device deteriorates and hence, it is unnecessary for the user to periodically exchange the device before the device deteriorates. In this manner, frequency of exchanging the device can be reduced and hence, operation efficiency of the device can be enhanced and a cost can be suppressed.

The power module 1 according to the embodiment 1 includes the deterioration determination part 60 which, in the deterioration determination mode, calculates the ΔVgs based on information including a threshold voltage $Vth_2$ detected before a stress current Is is supplied to the switching element 200 and a threshold voltage $Vth_3$ detected after the stress current Is is supplied to the switching element 200, and determines the deterioration based on information including the ΔVgs and an initial ΔVgs. With such a configuration, even when irregularities exit in a threshold voltage of the switching element 200 due to irregularities in manufacture, an actual threshold voltage of the switching element 200 which is actually provided to the power module can be measured and hence, ΔVgs can be accurately calculated. As a result, the deterioration during an actual in-use time can be accurately determined.

In the power module 1 according to the embodiment 1, the deterioration determination part 60, in an initial measurement mode, calculates an initial ΔVgs based on information including an initial threshold voltage $Vth_0$ which is a threshold voltage detected before a stress current Is is supplied to the switching element 200 and a threshold voltage $Vth_1$ detected after the stress current Is is supplied to the switching element 200. Accordingly, even when an actual threshold voltage changes from a designed threshold voltage due to irregularities in the manufacture of the switching element, the ΔVgs can be calculated based on the actual threshold voltage (the actual threshold voltage corresponding to the switching element even when irregularities exist without using a designed value). Accordingly, the actual deterioration can be accurately determined without using a designed value.

In the power module 1 according to the embodiment 1, the gate voltage control part 10, in the control mode, controls a gate voltage based on information including an initial threshold voltage $Vth_0$ measured by the initial measurement mode when the switching element 200 is brought into an ON state and hence, even when an actual threshold voltage changes from a designed threshold voltage due to irregularities in the manufacture of the switching element 200, in the control mode, the gate voltage control part 10 can apply a gate voltage which slightly exceeds an actual threshold voltage to the gate electrode based on the actual threshold voltage when the switching element 200 is brought into an ON state. Accordingly, compared to a case where a gate voltage which largely exceeds a preliminarily designed threshold voltage is applied to the gate electrode (comparison example, see FIG. 8A), a turn-on period and a turn-off period can be shortened and hence, a switching speed can be increased. As a result, a switching loss of the switching element 200 can be reduced.

In general, an actual threshold voltage of the switching element 200 changes from an initial threshold voltage $Vth_0$ due to a change in temperature of the switching element 200, and ΔVgs is relatively small and hence, it is difficult to accurately calculate an actual ΔVgs. However, according to the power module 1 of the embodiment 1, the deterioration determination part 60 determines the deterioration based on information relating to a temperature characteristic of a threshold voltage in the switching element 200, and information including an initial ΔVgs, a ΔVgs detected in the deterioration determination mode, an initial operation temperature $T_0$, and an operation temperature T of the switching element 200 detected by the temperature detection part 50 in the deterioration determination mode and hence, the threshold voltage can be calculated by taking into account a change in temperature whereby an actual ΔVgs which is possibly a relatively small value can be accurately calculated.

In the power module 1 according to the embodiment 1, the threshold voltage calculation part 70 calculates a threshold voltage Vth during the operation of the switching element 200 based on information including an operation temperature T of the switching element 200 detected by the temperature detection part 50, and the gate voltage control part 10, in the control mode, controls a gate voltage based on a threshold voltage Vth during the operation of the switching element 200 calculated by the threshold voltage calculation part 70 when the switching element 200 is brought into an ON state. Accordingly, even when a threshold voltage Vth during an operation of the device changes from an initial threshold voltage $Vth_0$ due to the increase of an operation temperature T of the switching element 200 during an operation from an initial operation temperature $T_0$ of the switching element 200, it is possible to apply a voltage which slightly exceeds the threshold voltage Vth during the operation to the gate electrode. Accordingly, a turn-on period and a turn-off period can be shortened and hence, a switching loss can be reduced.

In the power module 1 according to the embodiment 1, even when a difference between an absolute maximum rated voltage and a threshold voltage of the gate electrode is small as in the case of a switching element formed using a material which contains GaN, it is possible to apply a voltage which slightly exceeds a threshold voltage Vth during an operation of the device to the gate electrode. Accordingly, a turn-on period and a turn-off period can be shortened and hence, a switching loss can be reduced. Further, it is also possible to prevent the occurrence of "a phenomenon where the switching element 200 is not brought into an ON state even when a gate voltage which slightly exceeds a threshold voltage (designed threshold voltage) is applied to the gate electrode" due to a change in temperature of the threshold voltage Vth. As a result, an ON/OFF operation of the switching element 200 can be controlled with certainty.

In the power module 1 according to the embodiment 1, in the deterioration determination mode, the ON/OFF state determination part 30 determines an ON/OFF state of the switching element 200 based on a detection result of a switching current Id by the switching current detection part 20. Accordingly, a threshold voltage of the switching element 200 can be measured simply and with certainty.

The power module 1 according to the embodiment 1 includes the alarm part 80 which displays a detection result of the deterioration obtained by the deterioration determination part 60 to the outside. Accordingly, a user gets to know the deterioration even during an actual in-use time from the outside.

The power module 1 according to the embodiment 1 includes a stress current supply part 102 for supplying the stress current Is to the switching element 200 in the deterioration determination mode. Accordingly, it is possible to supply electricity to the switching element 200 under the same condition between the initial measurement mode and the deterioration determination mode. As a result, a difference between the ΔVgs and the initial ΔVgs can be accurately calculated and hence, the deterioration can be accurately determined.

In the power module 1 according to the embodiment 1, the gate voltage control part 10, in the deterioration determination mode and in the initial measurement mode, controls a gate voltage such that the gate voltage is increased in a stepwise manner along with a lapse of time. Accordingly, a threshold voltage of the switching element 200 can be measured efficiently and with certainty.

In the power module 1 according to the embodiment 1, the switching element 200 is formed of a material which contains GaN. Accordingly, an ON resistance of the switching element 200 is lowered and hence, it is possible to provide a power module having a small conduction loss.

Embodiment 2

A power module according to the embodiment 2 (not shown in the drawings) basically has substantially the same configuration as the power module 1 according to the embodiment 1. However, the power module according to the embodiment 2 differs from the power module 1 according to the embodiment 1 with respect to a point that the power module according to the embodiment 2 includes a temperature characteristic calculation part. The power module according to the embodiment 2 performs a temperature characteristic measurement mode where a temperature characteristic of a threshold voltage in a switching element 200 is measured after a control mode is performed for a predetermined time.

Figure 11:
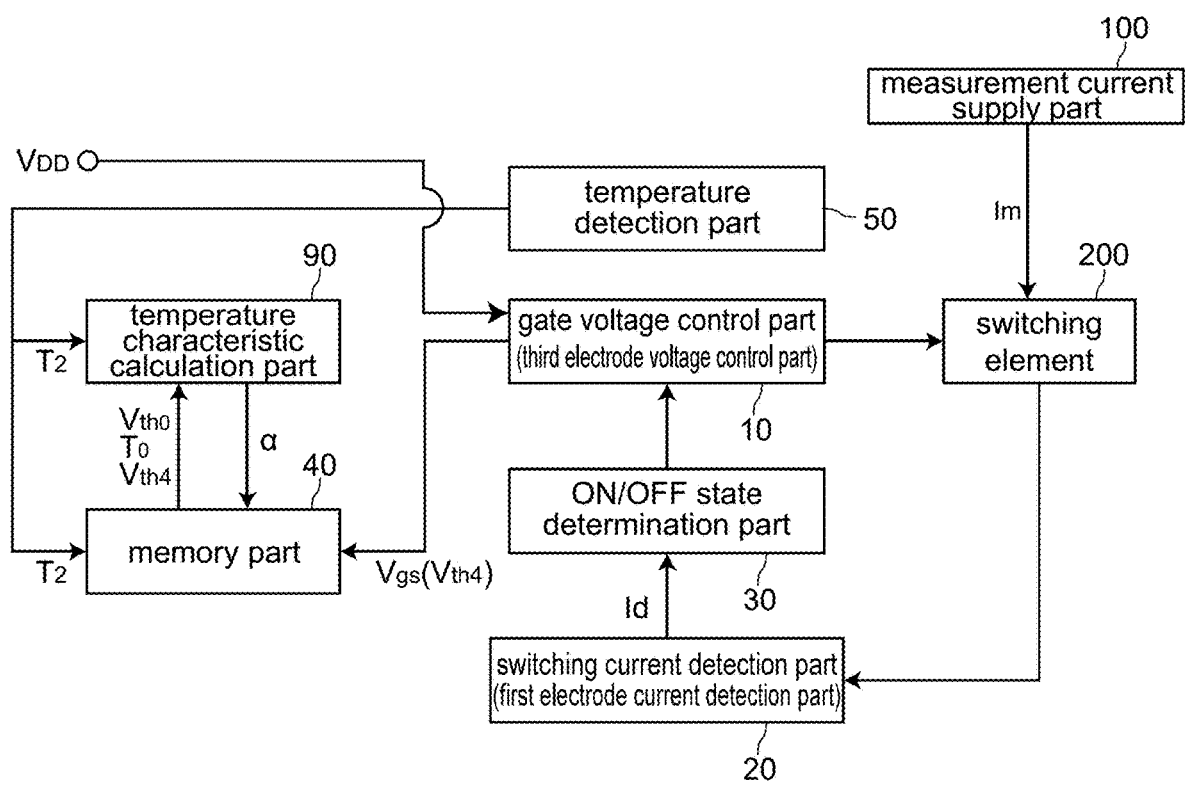
FIG. 11 is a block diagram for describing a temperature characteristic measurement mode in an embodiment 2.

The temperature characteristic calculation part 90 is connected with a temperature detection part 50 and a memory part 40, and calculates a temperature characteristic of a threshold voltage in the switching element 200 (see FIG. 11).

The following operation is performed in the temperature characteristic measurement mode.

After the control mode is performed for a predetermined time, a measurement current Im is supplied from a measurement current supply part 100 to a drain electrode of the switching element 200 in a state where a current is not supplied from a drive power source 420.

Next, the gate voltage control part 10 controls a gate voltage such that a voltage lower than a scheduled threshold voltage (during an operation) which is set at the time of designing the power module is applied to the gate electrode. At this stage of operation, a switching current is not detected by the switching current detection part 20 (a value of the switching current being 0) and hence, an ON/OFF state determination part 30 determines that the switching element 200 is in an OFF state. When the ON/OFF state determination part 30 determines that the switching element 200 is in an OFF state, the gate voltage control part 10 controls the gate voltage such that the gate voltage is increased by one stage (see FIG. 4).

When the gate voltage is increased in stages (specifically being increased in a stepwise manner) by repeating such an operation so that a switching current is detected by the switching current detection part 20 (the switching current taking a value other than n 0), the ON/OFF state determination part 30 determines that the switching element 200 is in an ON state. At this stage of operation, an operation temperature $T_2$ of the switching element 200 detected by the temperature detection part 50 is transmitted to the memory part 40, and the memory part 40 stores the operation temperature $T_1$ (see FIG. 1). Further, the gate voltage control part 10 transmits a gate voltage Vgs applied to the gate electrode to the memory part 40 as a temperature characteristic measurement time threshold voltage $Vth_4$, and the memory part 40 stores the gate voltage Vgs as the temperature characteristic measurement time threshold voltage $Vth_4$.

Next, the temperature characteristic calculation part 90 reads information including an initial threshold voltage $Vth_0$, an initial operation temperature $T_0$ of the switching element 200 when the initial threshold voltage $Vth_0$ is measured and the temperature characteristic measurement time threshold voltage $Vth_4$, and reads the operation temperature $T_2$ of the switching element 200 detected by the temperature detection part 50 in the temperature characteristic measurement mode, and calculates a temperature characteristic (to be more specific, a temperature coefficient α) by putting $Vth=Vth_4$ and $T=T_2$ to a characteristic equation of $Vth=Vth_0-\alpha(T-T_0)$ respectively. The calculated temperature coefficient α is stored in the memory part 40.

In the control mode, a threshold voltage calculation part 70 calculates a threshold voltage Vth during an operation based on the temperature coefficient α calculated in the temperature characteristic measurement mode, the operation temperature T of the switching element 200 detected by the temperature detection part 50, the initial threshold voltage $Vth_0$ stored in the memory part 40, the initial operation temperature $T_0$ of the switching element 200 when the initial threshold voltage $Vth_0$ is measured, and controls a gate voltage based on the threshold voltage Vth. In a deterioration determination mode, threshold voltages $Vth_2'$ and $Vth_3'$ where temperature correction is made are calculated using a temperature characteristic measured in the temperature characteristic measurement mode in a value which is obtained by the second time threshold voltage measurement.

In this manner, the power module according to the embodiment 2 differs from the power module 1 according to the embodiment 1 with respect to the point that the power module according to the embodiment 2 further includes the temperature characteristic calculation part. However, in the same manner as the case of the power module 1 according to the embodiment 1, the power module according to the embodiment 2 is configured to perform the deterioration determination mode where the ΔVgs is calculated based on information including a threshold voltage detected before a stress current is supplied to the switching element and a threshold voltage detected after the stress current is supplied to the switching element, and the deterioration is determined based on information including the ΔVgs. That is, the power module according to the embodiment 2 is configured such that the deterioration determination mode where ΔVgs is calculated and the deterioration is determined based on the information including the ΔVgs is performed and hence, the deterioration can be determined in an actual in-use time (an operation time) whereby it is possible to prevent breaking of a device caused by continuous use of the device in a deteriorated state.

Further, the power module according to the embodiment 2 includes the temperature characteristic calculation part 90, and the temperature characteristic calculation part 90 calculates a temperature characteristic of a threshold voltage of the switching element 200 based on information including an initial threshold voltage $Vth_0$, an initial operation temperature $T_0$ of the switching element 200 when the initial threshold voltage $Vth_0$ is measured, an operation temperature $T_2$ of the switching element 200 detected by the temperature detection part 50 in the temperature characteristic measurement mode, and a temperature characteristic measurement time threshold voltage $Vth_4$. Accordingly, even when irregularities exist in a temperature characteristic of a threshold voltage in the switching element 200, in the deterioration determination mode, a threshold voltage can be calculated accurately by taking into account irregularities in a temperature characteristic of the switching element 200. As a result, $\Delta Vgs$ can be calculated more accurately.

Further, the power module according to the embodiment 2 includes the temperature characteristic calculation part 90, and the temperature characteristic calculation part 90 calculates a temperature characteristic of a threshold voltage of the switching element 200 based on information including an initial threshold voltage $Vth_0$, an initial operation temperature $T_j$ of the switching element 200 when the initial threshold voltage $Vth_0$ is measured, an operation temperature T of the switching element 200 detected by the temperature detection part 50 in the temperature characteristic measurement mode, and a temperature characteristic measurement time threshold voltage $Vth_4$. Accordingly, even in the case where the actual temperature characteristic changes from a designed temperature characteristic due to irregularities in the manufacture of the switching element 200, a threshold voltage during an operation can be accurately calculated, and a voltage which slightly exceeds the threshold voltage Vth during the operation can be accurately applied to the gate electrode. Accordingly, a turn-on period and a turn-off period can be shortened. As a result, a switching loss can be reduced.

The power module according to the embodiment 2 has substantially the same configuration as the power module 1 according to the embodiment 1 with respect to points other than the point that the power module according to the embodiment 2 further includes the temperature characteristic calculation part. Accordingly, the power module according to the embodiment 2 acquires the corresponding advantageous effects found amongst all advantageous effects which the power module 1 according to the embodiment 1 acquires.

Embodiment 3

Figure 12:
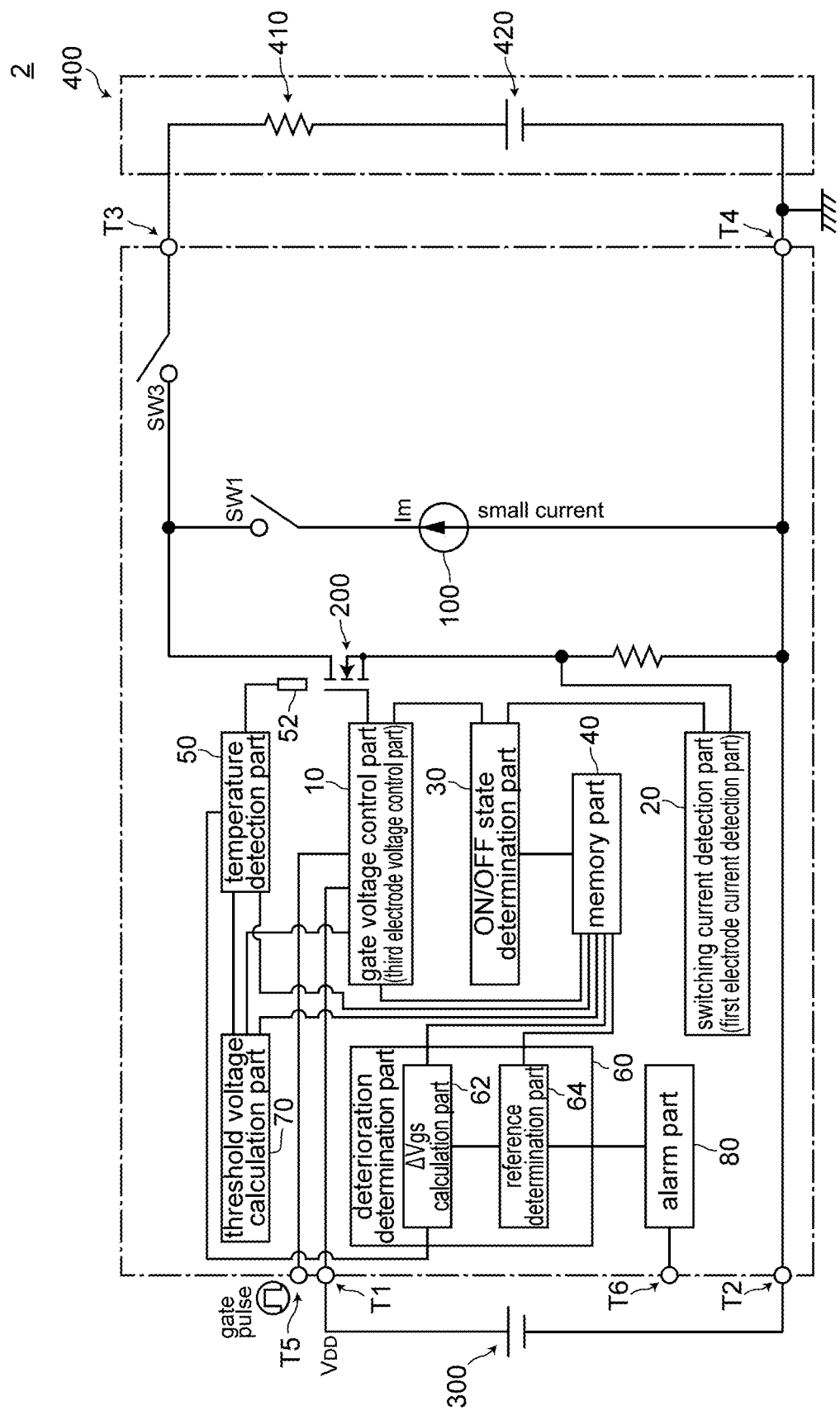
FIG. 12 is a circuit diagram of a power module 2 according to an embodiment 3.

A power module 2 according to the embodiment 3 basically has substantially the same configuration as the power module 1 according to the embodiment 1. However, the power module 2 according to the embodiment 3 differs from the power module 1 according to the embodiment 1 with respect to a point that the power module 2 according to the embodiment 3 does not include a stress current supply part. That is, in the power module 3 according to the embodiment 3, electricity supplied from a power circuit 400 is fixed, and in a deterioration determination mode, a stress current Is is supplied from a drive power source 420 (see FIG. 12).

In the power circuit 400, a resistance value of a load resistor 410 and a voltage value of the drive power source 420 are fixed and hence, electricity supplied from the power circuit 400 is fixed. In a deterioration determination mode, after a first time threshold voltage measurement is performed, electricity (corresponding to the stress current Is) is supplied to the power circuit 400 for a fixed period by the drive power source 420 and, thereafter, a second time threshold voltage measurement is performed by turning off the drive power source 420 thus calculating $\Delta Vgs$.

In this manner, the power module 2 according to the embodiment 3 differs from the power module 1 according to the embodiment 1 with respect to the point that the power module 2 according to the embodiment 3 does not include the stress current supply part. However, in the same manner as the case of the power module 1 according to the embodiment 1, the power module 2 according to the embodiment 3 is configured to perform the deterioration determination mode where the $\Delta Vgs$ is calculated based on information including a threshold voltage detected before a stress current is supplied to a switching element and a threshold voltage detected after the stress current is supplied to the switching element, and the deterioration is determined based on information including the $\Delta Vgs$. Accordingly, the deterioration can be determined in an actual in-use time (an operation time) whereby it is possible to prevent breaking of a device caused by continuous use of the device in a deteriorated state.

Further, the power module 2 according to the embodiment 3 does not include the stress current supply part and hence, a layout and the circuit configuration of the power module 2 becomes simple compared to the case where the power module includes the stress current supply part and hence, downsizing of the device can be realized.

The power module 2 according to the embodiment 3 has substantially the same configuration as the power module 1 according to the embodiment 1 with respect to points other than the point that the power module 2 according to the embodiment 3 does not include the stress current supply part. Accordingly, the power module 2 according to the embodiment 3 acquires the corresponding advantageous effects found amongst all advantageous effects which the power module 1 according to the embodiment 1 acquires.

The present invention has been described heretofore based on the above-mentioned embodiments, the present invention is not limited to the above-mentioned embodiments. The present invention can be carried out in various modes without departing from the gist of the present invention. For example, the following modifications are also conceivable.

(1) The number and the like of the constitutional elements described in the above-mentioned embodiments are provided only for an exemplifying purpose, and can be changed within a range where advantageous effects of the present invention are not impaired.

Figure 13:
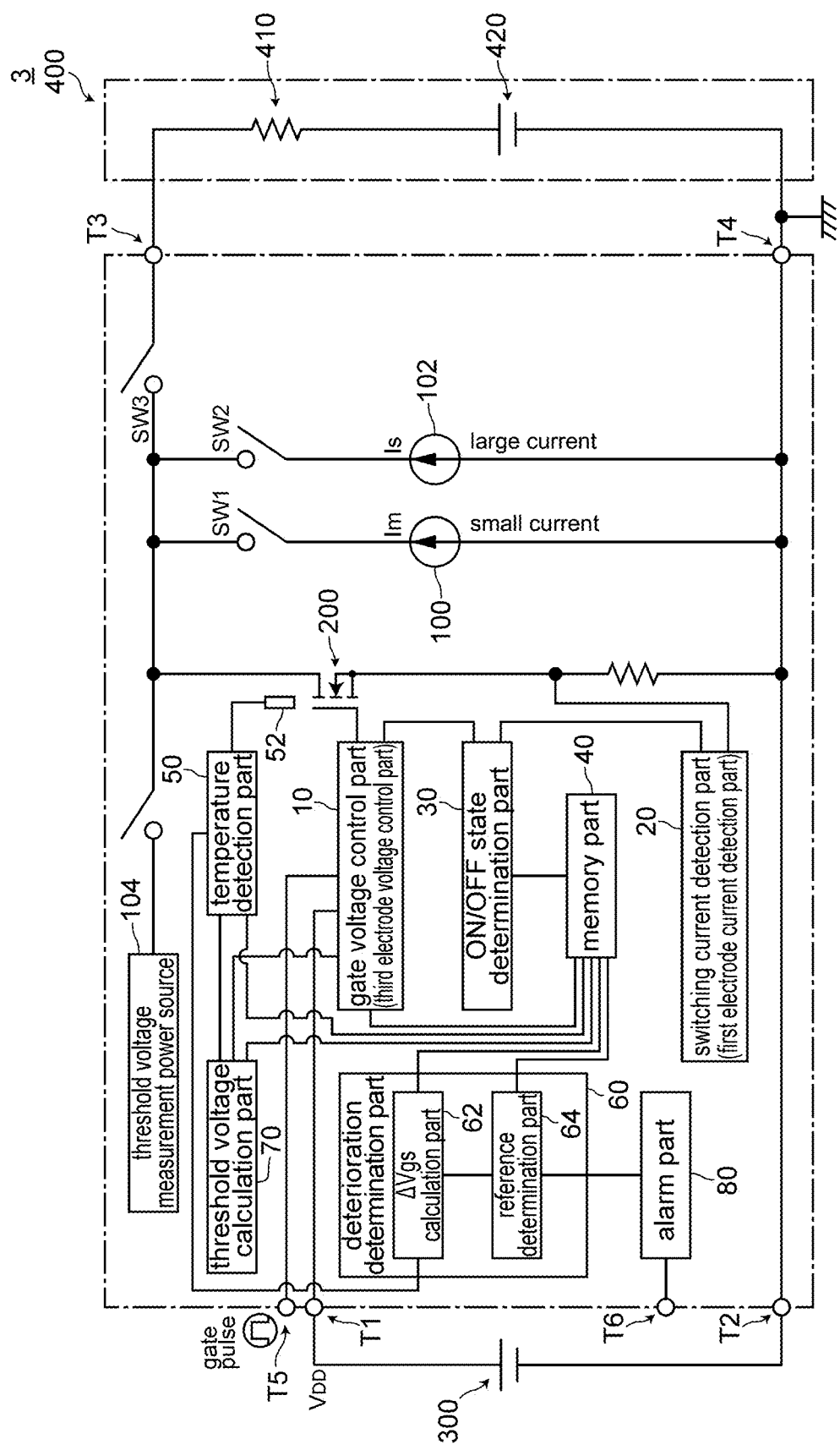
FIG. 13 is a circuit diagram of a power module 3 according to a modification 1.

(2) In the above-mentioned respective embodiments, a measurement current Im is supplied from the measurement current supply part 100 to the switching element 200 at the time of measuring a threshold voltage used in a control mode. However, the present invention is not limited to such a case. For example, a threshold voltage measurement power source 104 which is connected to the drain electrode of the switching element 200 is provided, and a current for threshold voltage measurement is supplied to the drain electrode of the switching element 200 thus measuring a threshold voltage used in the control mode (a power module 3 according to a modification 1, see FIG. 13). With such a configuration, a threshold voltage can be measured using a current under a condition (a current amount, a voltage or the like) which differs from a current supplied from a measurement current supply part 100 used at the time of measuring $\Delta Vgs$ and hence, a threshold voltage can be accurately measured in the control mode.

(3) In the above-mentioned respective embodiments, the power module which performs an initial measurement mode, a control mode, and a deterioration determination mode is used as the power module according to the present invention. However, the present invention is not limited to such a power module. For example, a power module which performs only a control mode and a deterioration determination mode may be adopted as the power module according to the present invention. In this case, an initial threshold voltage $Vth_0$ and an initial $\Delta Vgs$ are preliminarily stored in a memory part.

Figure 14:
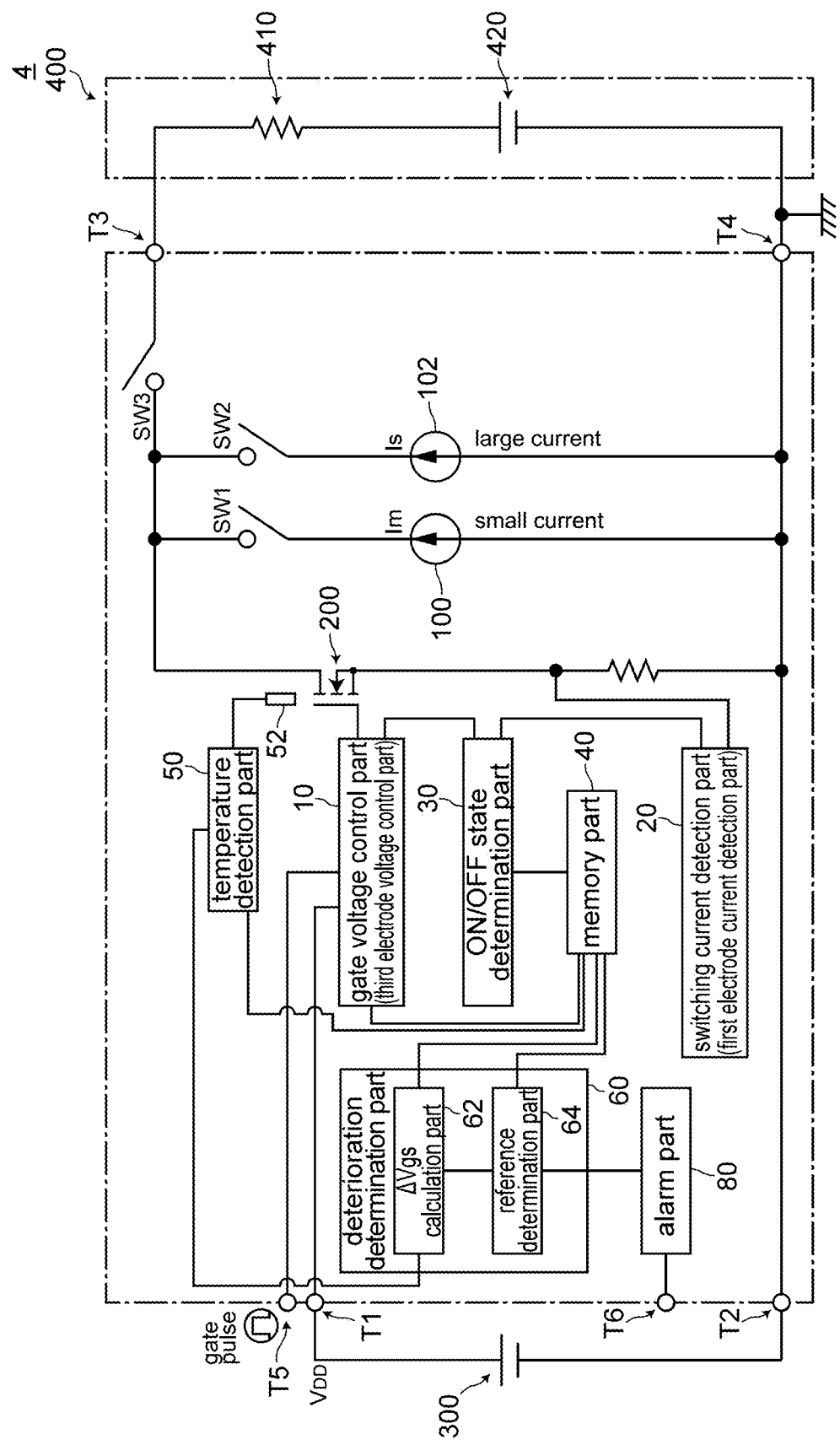
FIG. 14 is a circuit diagram of a power module 4 according to a modification 2.

(4) In the above-mentioned respective embodiments, in the control mode, a threshold voltage during an operation is calculated, and a gate voltage is controlled based on the threshold voltage during an operation. However, the present invention is not limited to such a control. For example, in the control mode, a gate voltage may be controlled based on an initial threshold voltage (a power module 4 according to a modification 2, see FIG. 14).

(5) In the above-mentioned respective embodiments, the characteristic equation which satisfies the relationship of $Vth=Vth_0-\alpha(T-T_0)$ is used as information relating to temperature characteristic of a threshold voltage of the switching element. However, the present invention is not limited to such a case. For example, the information relating to a temperature characteristic of a threshold voltage of a switching element may be another characteristic equation, or may be data indicating a relationship between a temperature and a threshold voltage preliminarily stored in a memory part (on a 1 to 1 basis).

Figure 15:
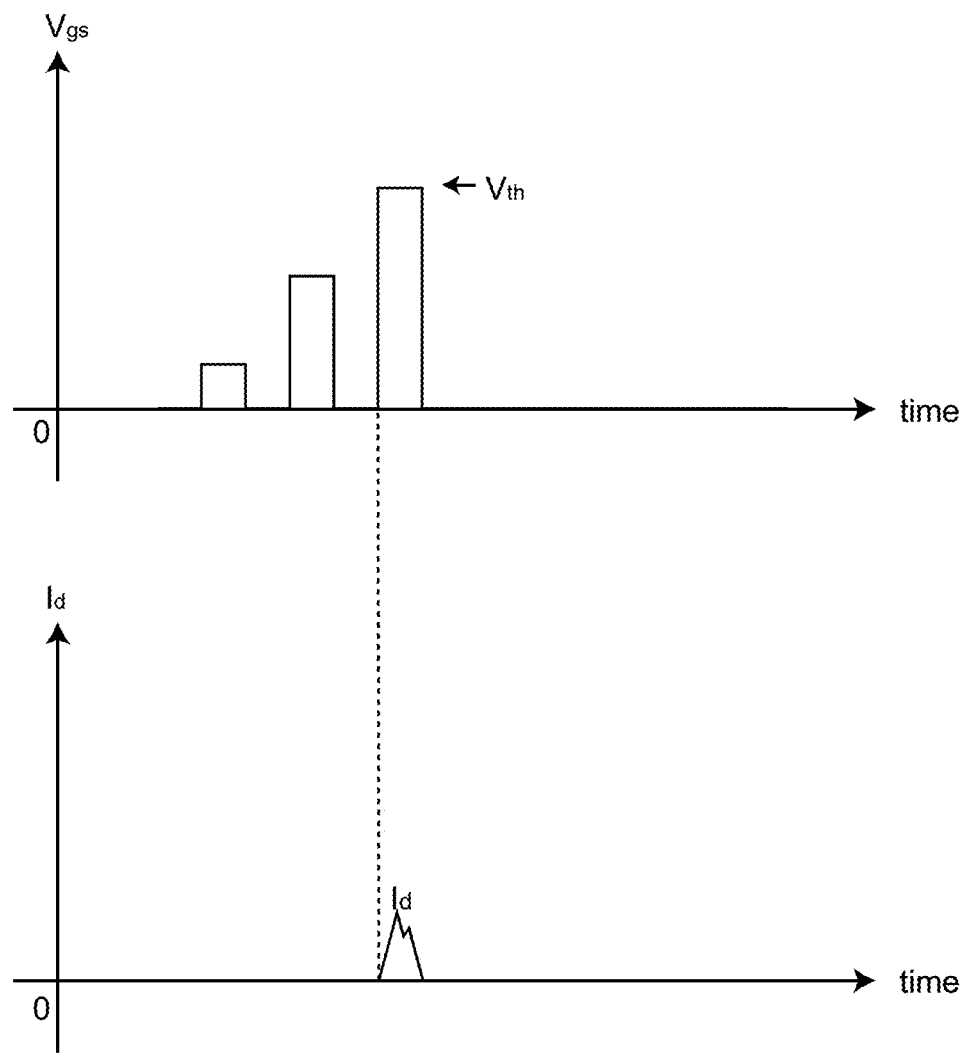
FIG. 15 is a schematic view of a graph for describing an initial threshold voltage measurement mode and (or) a deterioration determination measurement mode of a power module according to a modification 3.
Figure 16:
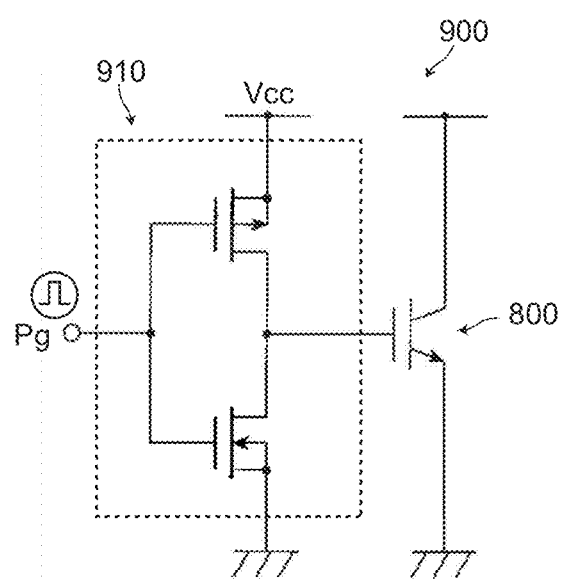
FIG. 16 is a view for describing a conventional power module 900.

(6) In the above-mentioned respective embodiments, in an initial measurement mode and a deterioration determination mode, the gate voltage control part 10 controls a gate voltage such that the gate voltage is increased in a stepwise manner with a lapse of time. However, the present invention is not limited to such a case. For example, the gate voltage control part 10 may control a gate voltage such that the gate voltage may become a pulse-like voltage which is a pulse whose amplitude is increased with a lapse of time (see FIG. 15).

(7) In the above-mentioned respective embodiments, the power module has one switching element. However, the present invention is not limited to such a configuration. The power module may include a plurality of switching elements. In this case, the power module may control the plurality of switching elements.

(8) In the above-mentioned respective embodiments, the switching element is formed using a material which contains GaN. However, the present invention is not limited to such a switching element. The switching element may be formed using a material which contains a wide gap semiconductor such as SiC or $Ga_2O_3$, or a material which contains silicon.

(9) In the above-mentioned respective embodiments, a MOSFET is used as the switching element. However, the present invention is not limited to such a switching element. A switching element other than a MOSFET (for example, a HEMT, an IGBT or the like) may be used as the switching element.

(10) In the above-mentioned respective embodiments, the control circuit and the power circuit of the power module may be formed as separate semiconductor substrates or the control circuit and the power circuit of the power module may be formed of the same semiconductor substrate. Further, the switching element and the circuit parts other than the switching element may be formed on separate semiconductor substrates or the switching element (for example, the semiconductor element having the lateral structure made of GaN) and the circuit parts other than the switching element may be formed on the same semiconductor substrate.

The invention claimed is:

1. A power module configured to switch an operation mode between: a control mode where an ON/OFF operation of a switching element having a first electrode, a second electrode, and a third electrode is controlled; and a deterioration determination mode where $\Delta Vgs$ is calculated based on information including a threshold voltage detected before a stress current is supplied to the switching element and a threshold voltage detected after the stress current is supplied to the switching element, and deterioration of a device is determined based on information including the $\Delta Vgs$.

2. The power module according to claim 1 comprising:
the switching element;
a third electrode voltage control part which controls a third electrode voltage such that the third electrode voltage is increased in a stepwise manner when a threshold voltage is measured in the deterioration determination mode, and controls the third electrode voltage for controlling an ON/OFF operation of the switching element in the control mode;
an ON/OFF state determination part which determines an ON/OFF state of the switching element in the deterioration determination mode;
a memory part which stores an initial $\Delta Vgs$ of the switching element, and in the deterioration determination mode, stores the third electrode voltage applied to the third electrode as a threshold voltage when the ON/OFF state determination part determines that the switching element is brought into an ON state;
a deterioration determination part which, in the deterioration determination mode, calculates the $\Delta Vgs$ based on information including a threshold voltage detected before the stress current is supplied to the switching element and a threshold voltage detected after the stress current is supplied to the switching element, and determines the deterioration based on information including the $\Delta Vgs$ and the initial $\Delta Vgs$; and
a power circuit which is connected with the switching element in series, and has a load resistor and a drive power source.

3. The power module according to claim 2, wherein the power module is configured to perform an initial measurement mode where the initial $\Delta Vgs$ of the switching element is detected before the control mode is performed,
in the initial measurement mode,
the third electrode voltage control part controls the third electrode voltage such that the third electrode voltage is increased in a stepwise manner when a threshold voltage is measured,
the ON/OFF state determination part determines an ON/OFF state of the switching element,
the memory part stores the third electrode voltage applied to the third electrode as a threshold voltage when the ON/OFF state determination part determines that the switching element is brought into an ON state, and
the deterioration determination part calculates the initial $\Delta Vgs$ based on information including an initial threshold voltage which is the threshold voltage detected before the stress current is supplied to the switching element and a threshold voltage detected after the stress current is supplied to the switching element.

4. The power module according to claim 3, wherein the third electrode voltage control part, in the control mode, controls the third electrode voltage based on information including the initial threshold voltage measured by the initial measurement mode when the switching element is brought into an ON state.

5. The power module according to claim 2, further comprising a temperature detection part which detects an operation temperature of the switching element, wherein
the memory part further stores information relating to a temperature characteristic of a threshold voltage in the switching element, and information including an initial operation temperature of the switching element, and the deterioration determination part determines the deterioration based on information relating to a temperature characteristic of a threshold voltage in the switching element, and information including the initial $\Delta Vgs$, the $\Delta Vgs$ detected in the deterioration determination mode, the initial operation temperature, and an operation temperature of the switching element detected by the temperature detection part in the deterioration determination mode.

6. The power module according to claim 5, further comprising a threshold voltage calculation part which calculates a threshold voltage during the operation of the switching element based on information including the operation temperature of the switching element detected by the temperature detection part, the initial threshold voltage and the initial operation temperature of the switching element, and information relating to a temperature characteristic of a threshold voltage in the switching element, wherein the third electrode voltage control part, in the control mode, controls the third electrode voltage based on a threshold voltage during the operation of the switching element calculated by the threshold voltage calculation part when the switching element is brought into an ON state.

7. The power module according to claim 5, wherein
the power module is a power module which further performs a temperature characteristic measurement mode where a temperature characteristic of a threshold voltage in the switching element is measured,
the power module further comprises a temperature characteristic calculation part which calculates a temperature characteristic of a threshold voltage in the switching element, wherein
in the temperature characteristic measurement mode,
the third electrode voltage control part controls the third electrode voltage such that the third electrode voltage is increased in a stepwise manner,
the ON/OFF state determination part determines whether or not the switching element is turned on,
the memory part, when the ON/OFF state determination part determines that the switching element is brought into an ON state, stores the operation temperature of the switching element, and stores the third electrode voltage applied to the third electrode as a temperature characteristic measurement time threshold voltage of the switching element, and the temperature characteristic calculation part calculates a temperature characteristic of a threshold voltage in the switching element based on the information including the initial threshold voltage, the initial operation temperature of the switching element when the initial threshold voltage is measured, the operation temperature of the switching element detected by the temperature detection part in the temperature characteristic measurement mode, and the temperature characteristic measurement time threshold voltage.

8. The power module according to claim 2, further comprising a first electrode current detection part which detects a first electrode current which flows in the switching element, wherein
in the deterioration determination mode, the ON/OFF state determination part determines an ON/OFF state of the switching element based on a detection result of the first electrode current obtained by the first electrode current detection part.

9. The power module according to claim 2, further comprising an alarm part which displays a detection result of deterioration obtained by the deterioration determination part to an outside.

10. The power module according to claim 2, further comprising a stress current supply part which supplies the stress current to the switching element in the deterioration determination mode.

11. The power module according to claim 2, wherein supplied power is constant in the power circuit, and
in the deterioration determination mode, the stress current is supplied from a current which flows from the drive power source.

12. The power module according to claim 2, wherein the third electrode voltage control part, when a threshold voltage of the switching element is detected, controls the third electrode voltage such that the third electrode voltage is increased in a stepwise manner along with a lapse of time.

13. The power module according to claim 2, wherein the third electrode voltage control part, when a threshold voltage of the switching element is detected, controls the third electrode voltage such that the third electrode voltage becomes a pulse-like voltage which is a pulse whose amplitude is increased along with a lapse of time.

14. The power module according to claim 1, wherein the switching element is formed of a material which contains GaN, SiC, or $Ga_2O_3$.

* * * * *